US006750799B1

(12) United States Patent
Opris

(10) Patent No.: US 6,750,799 B1
(45) Date of Patent: Jun. 15, 2004

(54) A/D CONVERSION TECHNIQUE USING DIGITAL AVERAGES

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 09/433,807

(22) Filed: Nov. 3, 1999

(51) Int. Cl.[7] .................................................. H03M 1/38
(52) U.S. Cl. ...................................... 341/161; 341/155
(58) Field of Search ................................. 341/161, 155, 341/163, 159, 1

(56) References Cited

U.S. PATENT DOCUMENTS

| 5,495,201 | A | * | 2/1996 | Alini et al. .................. 327/563 |
| 5,574,457 | A | * | 11/1996 | Garrity et al. .............. 341/172 |
| 5,644,267 | A | * | 7/1997 | Brianti et al. ................ 327/553 |
| 5,739,781 | A | * | 4/1998 | Kagey ......................... 341/155 |
| 5,825,318 | A | * | 10/1998 | Patapoutian et al. ......... 341/131 |
| 6,084,539 | A | * | 7/2000 | Yamada ....................... 341/155 |
| 6,097,326 | A | * | 8/2000 | Opris et al. .................. 341/161 |
| 6,426,662 | B1 | * | 7/2002 | Arcus ........................... 327/295 |

FOREIGN PATENT DOCUMENTS

WO        0169193     *  9/2001   ................ 341/143

OTHER PUBLICATIONS

Yu, Paul C. and Lee, Hae–Seung, "A Pipelined A/D Conversion Technique with Near–Inherent Monotonicity", IEEE Transactions on Circuits and Systems–II; Analog and Digital Signal Processing, vol. 42, No. 7., Jul. 1995, pp. 500–502.
Yu, Paul C. and Lee, Hae–Seung, "A 2.5–V, 12–b, 5–Msample/s Pipelined CMOS ADC", IEEE Journal of Solid–State Circuits, vol. 31, No. 12, Dec. 1996, pp. 1854–1861.

* cited by examiner

*Primary Examiner*—Peguy Jeanpierre
(74) *Attorney, Agent, or Firm*—Florin Alin Corie

(57) ABSTRACT

A method and apparatus for an improved A/D technique, and an architecture utilizing this technique is disclosed. By performing multiple conversions with circuit elements in a different arrangement for each conversion, and combining the results, an A/D technique that has reduced nonlinearities is achieved. By performing conversions in a cyclic architecture a power savings may be achieved.

13 Claims, 6 Drawing Sheets

US 6,750,799 B1

A/D CONVERSION TECHNIQUE USING DIGITAL AVERAGES

FIELD OF THE INVENTION

The present invention pertains to the field of electronic signal conversion. More particularly, the present invention relates to the ability to more accurately represent a signal after an analog-to-digital conversion.

BACKGROUND OF THE INVENTION

An N-bit algorithmic (either pipeline or cyclic) analog-to-digital converter (ADC) may include J K-bit stages, where J*K=N. Each of the K-bit converter stages may have the general architecture of FIG. 1. The input signal or output from a prior stage is denoted by Residue$_{i-1}$ and is connected to a sample-and-hold (S/H) circuit. The output of the S/H connects to a K-bit analog to digital subconverter (ADSC) and the positive input (+) of a summation component ($\Sigma$). The output of the K-bit ADSC goes to a K-bit digital-to-analog converter (DAC), whose output goes to the negative input (−) of the summation component ($\Sigma$). The output of the summation component ($\Sigma$) then goes to an amplifier (A$_v$) that has a gain of $2^K$. The output of the amplifier is the output of the stage and is denoted by Residue$_i$.

Operationally, the K-bit analog to digital subconverter (ADSC) estimates the analog input, and the digital code is used by a local K-bit digital-to-analog converter (DAC) to create an analog estimate of the input voltage. This estimate is subtracted from the original analog input and the residue (an analog remainder) is passed on to the next stage for processing after being amplified by a gain of $2^K$. The resulting residue can be calculated from equation (1).

$$Vres_i = 2^K(Vres_{i-1} - Vdac_i) \quad (1)$$

In equation (1), Vres$_i$ denotes the residue voltage, K denotes the number of bits in the digital-to-analog converter, Vres$_{i-1}$ denotes the residue voltage from a prior stage or the input, and Vdac$_i$ represents the output voltage of the K-bit DAC.

The overall linearity of an algorithmic ADC is determined by the linearity of the DAC stage. An attractive solution, especially for high speed applications, is to use a 1-bit ADSC and DAC. With a single-bit decision, there is always a straight line that can be drawn between the positive and negative reference voltages. In this case, the ideal gain of the converter stage is 2.

The residue equation in the case of a 1-bit decision and a converter stage gain of 2 is given by equation (2), where the data (D$_i$) can have one of two values, −1 or +1.

$$Vres_i = 2 \cdot Vres_{i-1} - D_i \cdot Vref \quad (2)$$

In equation (2), Vres$_i$ denotes the residue voltage, Vres$_{i-1}$ denotes the residue voltage from a prior stage or the input, D$_i$ denotes the data input and can at any given pipeline stage be either a −1 or +1 value, and Vref represents a reference voltage.

An ideal transfer characteristic from equation (2) is shown in FIG. 2.

FIG. 3 illustrates an analog residue computation circuit that uses two phases to compute the residue. During phase 1 of a non-overlapping clock (the sample phase), switch S$_{1C}$, holds the operational amplifier A$_1$ 316 as a voltage follower and the input voltage Vres$_{i-1}$ 304 minus any operational amplifier offset is sampled on the two capacitors C$_1$ and C$_2$ through switches S$_{1A}$ and S$_{1B}$ respectively. During phase 2 of the non-overlapping clock (the hold phase), one side of capacitor C$_1$ node 310 is connected to the operational amplifier output 318 through switch S$_{2B}$ and the other capacitor C$_2$ has one side node 308 connected to Di*Vref 306 through switch S$_{2A}$. C$_1$ and C$_2$ can be defined as related by equation (3a).

$$C_1 = C, \text{ and } C_2 = (1+\alpha_i)C \quad (3a)$$

In equation (3a), C$_1$ and C$_2$ represent the capacitance, C represents a normalized capacitance equivalent to C$_1$, and $\alpha_i$ denotes the capacitor mismatch between C$_1$ and C$_2$.

The output voltage (the analog residue) is given by equation (3).

$$Vres_i = ((2+\alpha_i) \cdot Vres_{i-1} - (1+\alpha_i) \cdot D_i \cdot Vref) \cdot (1-\epsilon_i) + Vofs_i \quad (3)$$

In equation (3); Vres$_i$ denotes the residue voltage, as denotes capacitor mismatch; Vres$_{i-1}$ denotes the residue voltage from a prior stage or the input; D$_i$ denotes the data input and can at any given pipeline stage be either a −1 or +1 value; Vref represents a reference voltage; $\epsilon_i$ represents the error due to finite operational amplifier gain and settling; and Vofs$_i$ represents a total offset term due to the charge injection effects and operational amplifier offset.

These error terms affect the linearity of the overall converter. In particular, while the operational amplifier can be designed with high enough gain and speed such that the errors due to the operational amplifier are minimized, the capacitor mismatches have a technological limit that usually limits the accuracy to no better than about 10-bits. For higher resolution converters many calibration and/or correction techniques have been developed.

For certain applications, such as digital imaging, only the differential non-linearity (DNL) is critical. A commutated feedback capacitor switching technique has been developed to reduce the DNL even with relatively large capacitor mismatches. See Paul C. Yu and Hae-Seung Lee, "A Pipelined A/D Conversion Technique With Near-Inherent Monotonicity", IEEE Transactions on Circuits and Systems II, vol. 42, pp. 500–502, July 1995; Paul C. Yu and Hae-Seung Lee, "A 2.5-V, 12-b, 5-MSample/s Pipelined CMOS ADC", IEEE Journal of Solid-State Circuits, vol. 31, pp. 1854–1861, December 1996. This commutated feedback capacitor switching technique relies on the observation that the DNL is determined by the height of the transition gap in the transfer characteristic of FIG. 2. At any particular conversion stage, the transition from Di=−1 to Di=+1 in the digital domain corresponds to a translation with +2Vref on the y-axis of the right half of the transfer characteristic. This effect is shown in FIG. 4. If the transition gap height is very close to 2Vref, there may be no discontinuity in the equivalent transfer characteristic and the DNL will be small.

This commutated feedback capacitor switching technique achieves a very small DNL by swapping the capacitors used in the hold phase across the operational amplifier for the two regions of the transfer characteristic. Thus, neglecting the errors due to the operational amplifier finite gain and settling, the output voltage in the region Di=−1 is given by equation (4).

$$Vout = \left(\frac{C_1+C_2}{C_1} \cdot Vin + \frac{C_2}{C_1} \cdot Vref\right) + Vofs_i \quad (4)$$

The output voltage in the region Di=+1 is given by equation (5).

$$Vout = \left(\frac{C_1 + C_2}{C_2} \cdot Vin + \frac{C_1}{C_2} \cdot Vref\right) + Vofs_i \qquad (5)$$

In equation (4) and equation (5), Vout represents the output voltage, $C_1$ and $C_2$ represent capacitance, Vin represents the input voltage, Vref represents a reference voltage, and $Vofs_i$ represents a total offset term due to charge injection effects and operational amplifier offset.

From equations (4) and (5), the transition gap height can be derived as shown in equation (6), which is equal to 2 Vref up to a second error term.

$$\Delta Vout = \left(\frac{C_1}{C_2} + \frac{C_2}{C_1}\right) \cdot Vref \approx \left(2 + \frac{\alpha_i^2}{2}\right) \cdot Vref \qquad (6)$$

In equation (6) $\Delta Vout_{vin=0}$ denotes the transition gap height of Vout evaluated at Vin=0.

Although the commutated feedback capacitor switching technique improves the DNL to negligible values for practical purposes, it does not affect the integral non-linearity (INL), which remains largely determined by the capacitor matching. Certain applications, especially in communications, are very sensitive to INL errors, since these types of nonlinearities create distortion and tones in the received signal.

Thus, it is desirable to provide an analog-to-digital converter (ADC) with lowered INL errors.

SUMMARY OF THE INVENTION

The present invention includes a method and apparatus for an improved analog-to-digital (A/D) conversion technique that results in reduced nonlinearities. An input signal is sampled multiple times. During conversion N, the input signal is presented to a first configuration of the A/D and the conversion N takes place. During conversion N+1, the input signal is presented to a second configuration of the A/D and conversion N+1 takes place. The results of conversion N and N+1 are then combined. The combined result has reduced nonlinearities.

Also described is a cyclic converter architecture which by utilizing the conversion technique herein disclosed, may provide lower power consumption at a given N bit resolution.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which:

FIG. 8 is a flow diagram of A/D conversion and the combining of A/D results;

FIG. 9 is a flow diagram of one embodiment of a configuring and conversion process; and FIG. 10 shows one embodiment for reconfiguring elements to set up different A/D configurations.

DETAILED DESCRIPTION

A method and apparatus for an improved analog-to-digital (A/D) converter is described. The A/D converter, by performing multiple A/D conversions, where elements are electrically rearranged for the conversions, and the resultant outputs are then combined, reduces nonlinearities in the final digital representation of the input signal.

Figure 4:
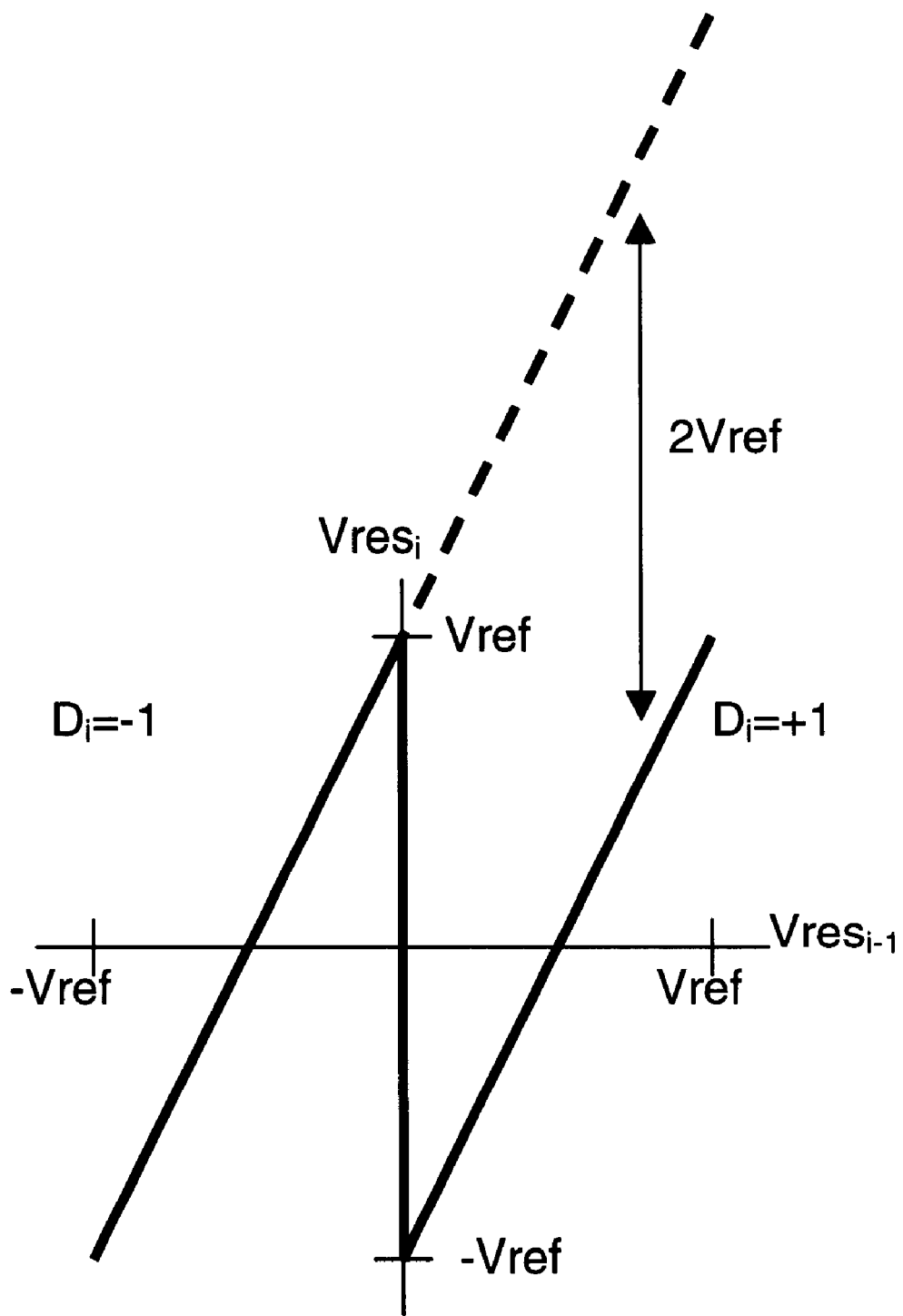
FIG. 4 is a diagram of a residue transfer function including the digital domain translation.
Figure 5:
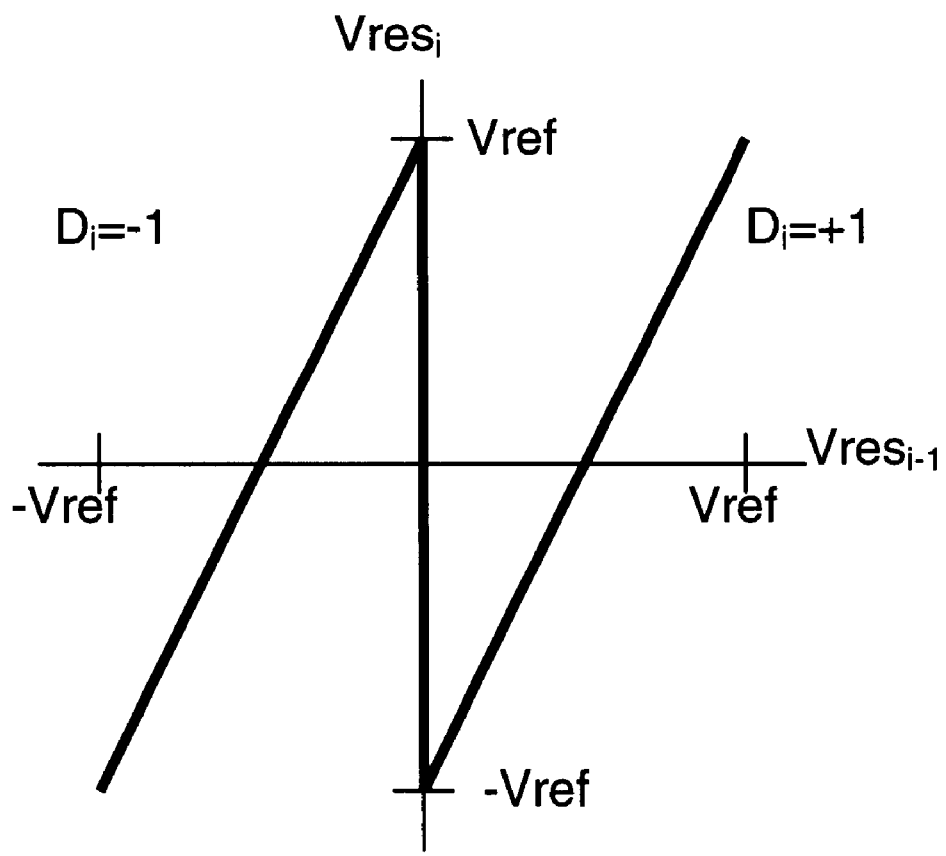
FIG. 5 is a diagram of a one-bit-per-stage transfer function with the commutated feedback capacitor switching technique.
Figure 6:
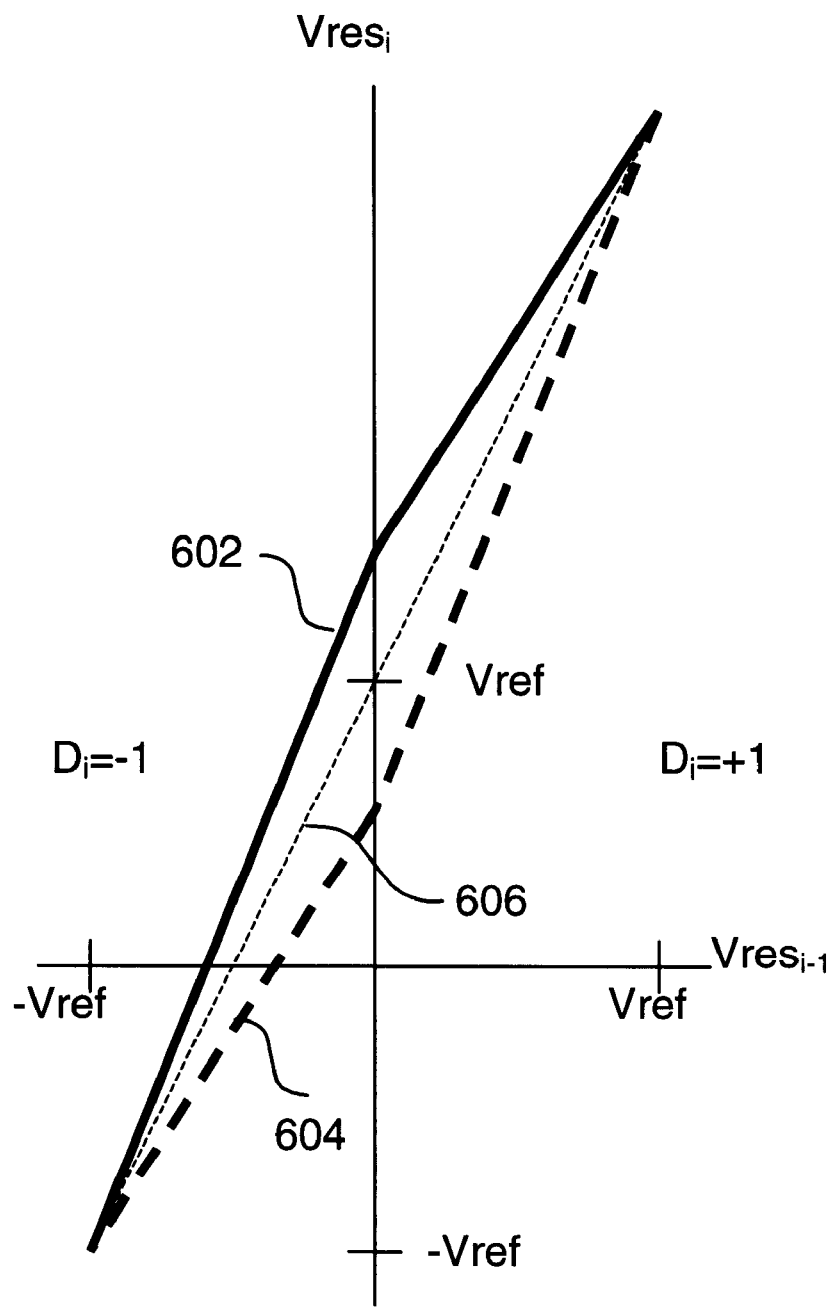
FIG. 6 is a diagram of a one-bit-per-stage residue transfer function with digital domain translation including capacitor mismatch.

The transfer characteristic of a commutated feedback capacitor converter stage is given by equations (4) and (5) and is shown in FIG. 5 at an exaggerated scale. After the digital domain translation as in FIG. 4, the transfer characteristic shows very good DNL but poor INL as shown in FIG. 6. In FIG. 6, the solid thick line 602 represents the residue transfer characteristic due to capacitor mismatch (exaggerated), while the thin dashed line 606 represents an ideal transfer characteristic. It is clear from the equations (4) and (5) that the slopes in the two regions of conversion, Di=−1 and Di=+1, are determined by $1+C_2/C_1$ and $1+C_1/C_2$, respectively.

By exchanging the roles of the two capacitors $C_1$, and $C_2$, the slopes of the residue transfer function are reversed, while the end points for Vin=−Vref and Vin =+Vref remain unchanged. The transfer function in this case is the thick dashed line 604 in FIG. 6.

The technique presented in this disclosure includes doing two consecutive A/D conversions for each input sample and combining the digital results. Mathematically, this is equivalent to having a transfer characteristic given by equation (7).

$$Vout = \left[\frac{1}{2} \cdot \left(2 + \frac{C_2}{C_1} + \frac{C_1}{C_2}\right) \cdot Vin \pm \frac{1}{2} \cdot \left(\frac{C_2}{C_1} + \frac{C_1}{C_2}\right) \cdot Vref\right] + Vofs_i \qquad (7)$$

In equation (7), the ±sign refers to the two regions, Di=−1 and Di=+1.

Equation (7) predicts a transition gap height equal to 2Vref up to a second error term (see equation (6)), and a transfer slope very close to 2. This corrected slope is given by equation (8).

$$\frac{\Delta Vout}{\Delta Vin} = 1 + \frac{1}{2} \cdot \left(\frac{C_1}{C_2} + \frac{C_2}{C_1}\right) \approx \left(2 + \frac{\alpha_i^2}{4}\right) \qquad (8)$$

In equation (8), $\Delta Vout/\Delta Vin$ represents the transfer slope.

Note that from the last term in equation (8), the INL is improved even more than the DNL by an extra factor of 2 (equivalent to 1 bit of resolution).

Thus, what has been described above by way of a detailed example is an averaging method in the digital domain. Two complete analog-to-digital conversions are done on each sample and the digital results are averaged. Since division by 2 is equivalent to an extra bit of resolution, an N-bit A/D converter that does two consecutive conversions with the roles of the capacitors swapped as proposed herein is capable of outputting an N+1 bit result.

Because it is possible to obtain an N+1 bit result from multiple conversions of an N bit converter, it is also possible to obtain an N bit result from multiple conversions of an N−1 bit converter. Thus, several new techniques are possible for a given N bit conversion. For example, the multiple conversions do not have to be completely independent of each other. For instance, in a pipeline converter, the second conversion may start before the first conversion is finished. The delay between the two conversions may be as low as 1 pipeline clock. Since two conversions are needed for each sample, in order to achieve an N bit conversion from two N−1 conversions, in the time that it would normally take a single N bit converter to do the conversion, the pipeline clock has to be substantially twice the speed of the sample clock. This double frequency clocking of the pipeline has several important consequences.

First, latency may be reduced. For a normal M-stage pipeline, the latency is M/2 sample clocks. Using a faster clock and doing a digital average, the latency may become (M/2)+1 pipeline clocks, or (M/4)+(1/2) sample clocks, which is smaller than in a regular design.

Second, the power dissipation is, to a first order, substantially unchanged. At first look, the power dissipation should increase since the pipeline is working at twice the speed; however, the averaging operation reduces the random noise, assumed uncorrelated between consecutive conversions, by a factor of 2 in power. The power of the random noise is inversely proportional to the power dissipation in the circuit. For example, for switched capacitor circuits, the power of the random noise is inversely proportional to the capacitor sizes. To achieve the same noise performance as a regular pipeline, the capacitors in the proposed pipeline may be only half the size of those in the regular pipeline. Since the power is also proportional to the speed of the circuit, the actual power dissipation remains substantially unchanged.

Third, the area of the circuit is only slightly affected. The higher speed requires slightly more area for the active circuitry, however, the capacitors are smaller, and thus their area is reduced.

Figure 7:
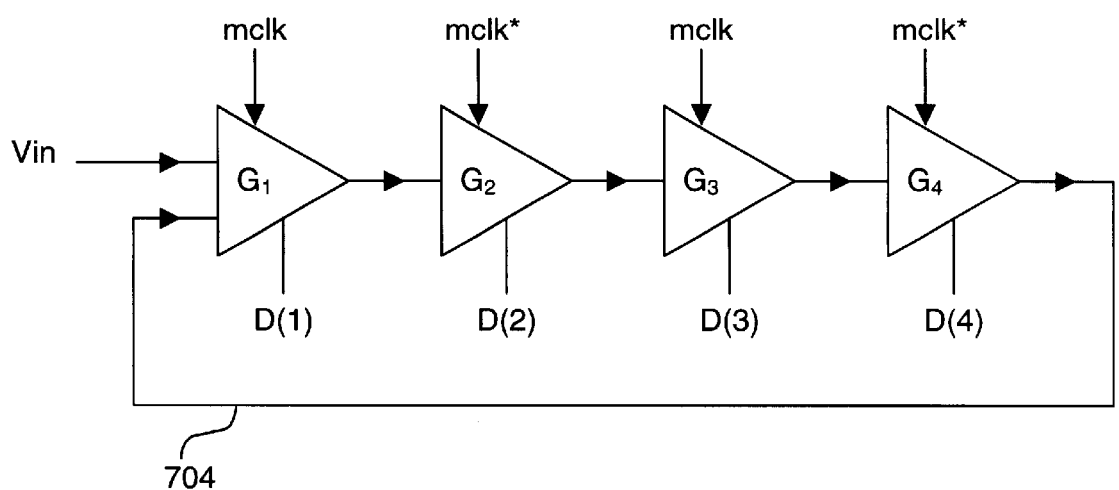
FIG. 7 is a block diagram of a cyclic converter architecture.

FIG. 7 illustrates an architecture that may be used to implement this new conversion method for cyclic converters. Illustrated in FIG. 7, the converter ring includes four serially connected conversion stages $G_1$, $G_2$, $G_3$, and $G_4$. Stage $G_1$ has two possible analog inputs denoted as Vin and signal 704. The analog output of $G_1$ is coupled to the analog input of $G_2$, the analog output of $G_2$ is coupled to the analog input of $G_3$, the analog output of $G_3$ is coupled to the analog input of $G_4$, and the analog output of $G_4$ 704 is coupled to the analog input of $G_1$. Stages $G_1$ and $G_3$ are clocked by the signal mclk. Stages $G_2$ and $G_4$ are clocked by the compliment of the mclk signal, denoted as mclk*. Vin denotes the original analog input signal and 704 denotes a new analog input signal to $G_1$ as the result of a cyclic conversion emanating from the analog output of $G_4$. D(1), D(2), D(3), and D(4) represent the digital signals representing the output at each of the $G_1$, $G_2$, $G_3$, and $G_4$ respective stages of conversion during any cyclic conversion cycle. The second conversion cycle may start in this case with one conversion clock delay from the first conversion. The analog residues from the two consecutive conversions will reside and propagate simultaneously in the four stage ring, with 1 clock delay between them.

This arrangement reduces the speed of the conversion clock to N/4 times the sample clock. The power per stage is reduced due to the lower speed. The four stages can have a smaller capacitor size for noise considerations, as explained earlier. In the first order approximation, the area of the four stage conversion ring remains substantially the same as for a two stage cyclic design, while the power dissipation may be reduced due to lower capacitor sizes in each stage.

FIG. 8 is a flow diagram of A/D conversion and the combining of A/D results. The input signal 802 is converted at 804 (perform $1^{st}$ A/D) and at 806 (perform $2^{nd}$ A/D). The results of the $1^{st}$ A/D and $2^{nd}$ A/D are combined at 808.

FIG. 9 is a flow diagram of one embodiment of a configuring and conversion process. The A/D conversion system is configured to configuration 1 at 902, and an A/D conversion is then performed on the input signal at 904. Then the A/D conversion system is configured to configuration 2 at 906, and an A/D conversion is performed on the input signal at 908.

Figure 1:
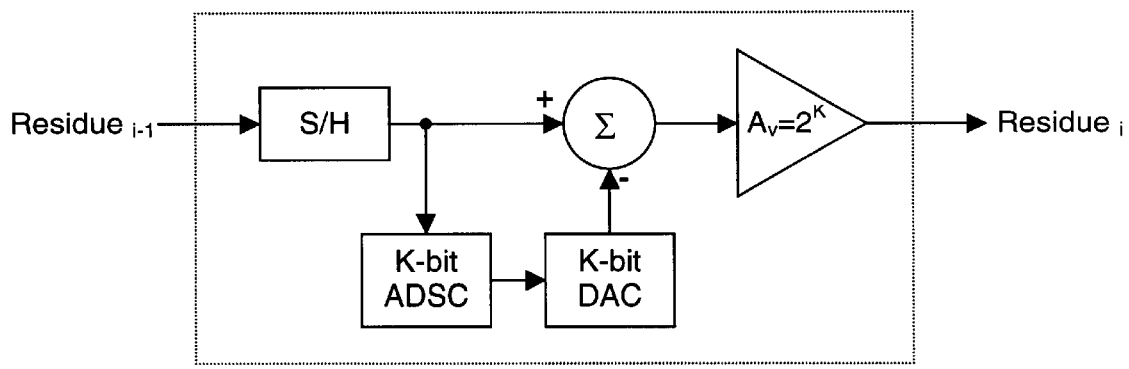
FIG. 1 is a block diagram of a single stage of a pipeline analog-to-digital (A/D) converter.
Figure 2:
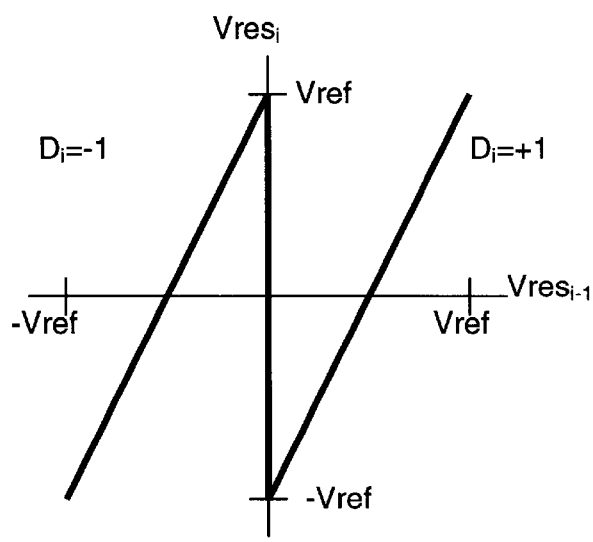
FIG. 2 is a diagram of a one-bit-per-stage residue transfer function.
Figure 3:
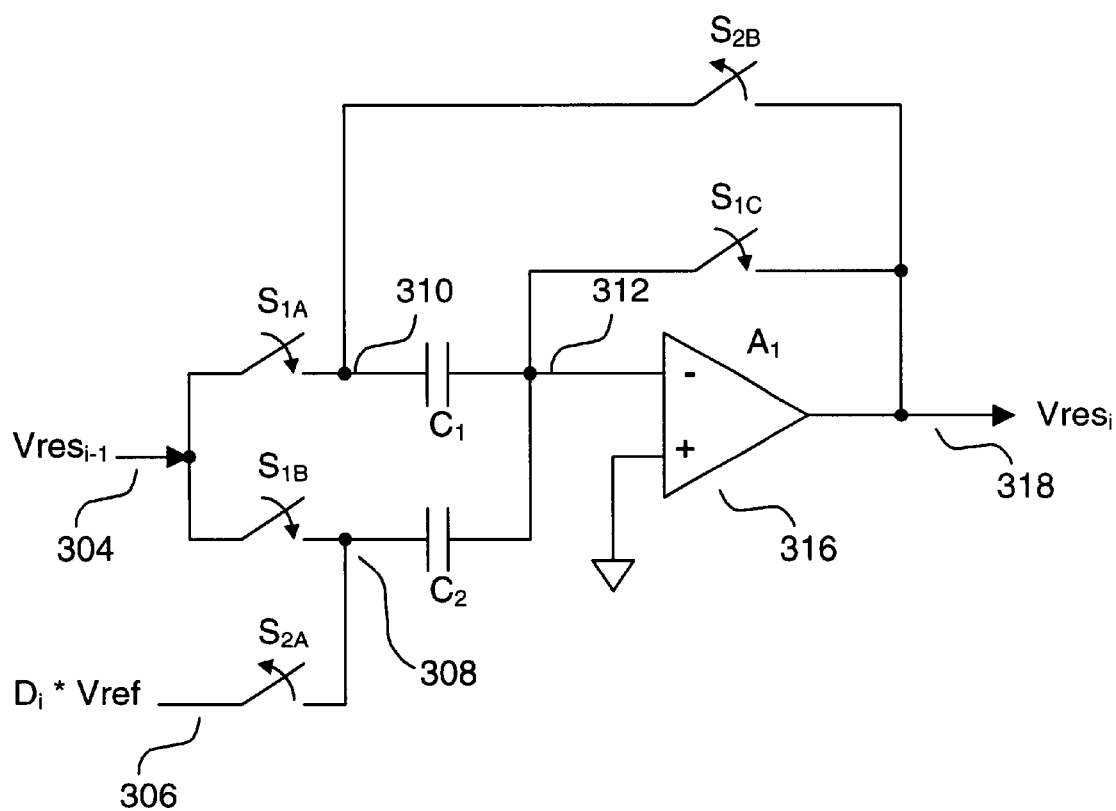
FIG. 3 is a schematic diagram of an analog residue computation circuit.

FIG. 10 shows one embodiment for reconfiguring elements to set up different A/D configurations. Dual pole ganged switch 1002 has a position $SX_1$ which represents the first configuration of the A/D converter stage as was illustrated in FIG. 3. Dual pole ganged switch 1002 has a position $SX_2$ which represents the second configuration of the A/D converter stage. Thus, this embodiment shows one possible technique for exchanging the roles of capacitors $C_1$ and $C_2$. Operation of a converter stage as shown in FIG. 3 has been previously described.

Thus, an analog-to-digital converter (ADC) technique with lowered INL errors has been described as well as an architecture for implementing this technique, which may result in power savings. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An analog-to-digital (A/D) conversion system comprising:

a first conversion stage, having an input and an output, wherein the first conversion stage receives an input signal on the first conversion stage input, converts the input signal, and produces an output signal on the first conversion stage output;

a second conversion stage, having an input and an output, wherein the second conversion stage receives the first conversion stage output on the second conversion stage input, converts the first conversion stage output signal, and produces an output signal on the second conversion stage output;

a third conversion stage, having an input and an output, wherein the third conversion stage receives the second conversion stage output on the third conversion stage input, converts the second conversion stage output signal, and produces an output signal on the third conversion stage output;

a fourth conversion stage, having an input land an output, wherein the fourth conversion stage receives the third conversion stage output on the fourth conversion stage input, converts the third conversion stage output signal, and produces an output signal on the fourth conversion stage output; and wherein the above steps are repeated with the fourth conversion stage output as the input signal until a desired N-bit resolution is achieved.

2. The analog-to-digital (A/D) conversion system according to claim 1, wherein the first, second, third, and fourth conversion stages each perform a conversion comprising:

performing a first conversion on an input signal;

performing a second conversion on the input signal; and combining the first and second conversion.

3. The method according to claim 2, wherein:

performing the first A/D conversion further comprises presenting the input signal to a first configuration of the A/D conversion system; and performing the second A/D conversion further comprises presenting the input signal to a second configuration of the A/D conversion system different from the first configuration.

4. The method according to claim 3, wherein the first configuration comprises a first configuration of ratioing elements and the second configuration comprises a second configuration of ratioing elements.

5. The analog-to-digital (A/D) conversion system according to claim 1, wherein the first, second, third, and fourth conversion stages each further comprise:

a plurality of switches coupled to the conversion stage input;

storage elements coupled to the plurality of switches; and an amplifier coupled to the plurality of switches and the storage elements, such that the amplifier produces an output signal on the conversion stage output.

6. A pipeline converter apparatus for producing an N bit analog-to-digital (A/D) conversion result comprising:

an input signal;

a first converter stage, having a signal input, a clock input, a signal output, and a digital output, wherein the signal input is coupled to the input signal and the clock input is coupled to a first clock;

a second converter stage, having a signal input, a clock input, a signal output, and a digital output, wherein the signal input is coupled to the first converter stage signal output and the clock input is coupled to a second clock;

a third converter stage, having a signal input, a clock input, a signal output, and a digital output, wherein the signal input is coupled to the second converter stage signal output and the clock input is coupled to the first clock;

a fourth converter stage, having a signal input, a clock input, a signal output, and a digital output, wherein the signal input is coupled to the third converter stage signal output and the clock input is coupled to the second clock; and the fourth converter stage signal output is coupled as the input signal to the first converter stage after the fourth conversion, and the conversion proceeds until the desired N bit conversion is achieved from the first, second, third, and fourth converter stage digital outputs.

7. The apparatus according to claim 6, wherein the first and the second clock are complimentary.

8. The apparatus according to claim 6, wherein the N bit A/D conversion result comprises combining N–1 bit A/D conversion results.

9. The apparatus according to claim 8, wherein the N–1 bit A/D conversion comprises:

a first and a second configuration for the first converter stage, the second converter stage, the third converter stage, and the fourth converter stage; and the signal input of each converter stage is first coupled to the first configuration of each converter stage and then to the second configuration of each converter stage.

10. The apparatus according to claim 9, wherein the coupling to the first configuration of each converter stage and then to the second configuration of each converter stage is controlled based on the converter stage clock input.

11. The apparatus according to claim 6, wherein a subsequent converter stage conversion may start before a prior converter stage conversion is finished.

12. The apparatus according to claim 11, wherein the delay between the conversions may be as low as one pipeline clock.

13. A pipeline conversion apparatus comprising:

a plurality of conversion stages, each conversion stage having a first configuration and a second configuration and being coupled to a prior adjacent conversion stage and to a subsequent adjacent conversion stage of said plurality of conversion stages;

said each conversion stage to receive an input signal and to perform a first conversion on said first configuration and a second consecutive conversion on said second configuration for said input signal, to average results of said first and second conversions.

* * * * *